United States Patent
Jeong et al.

(10) Patent No.: US 6,743,555 B2
(45) Date of Patent: Jun. 1, 2004

(54) EXPOSURE MASK FOR LIQUID CRYSTAL DISPLAY DEVICE AND EXPOSURE METHOD THEREOF

(75) Inventors: Hun Jeong, Kyongsangbuk-do (KR); Soon Kwang Hong, Taegu-kwangyokshi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/291,769

(22) Filed: Nov. 12, 2002

(65) Prior Publication Data

US 2003/0123014 A1 Jul. 3, 2003

(30) Foreign Application Priority Data

Dec. 28, 2001 (KR) ........................ P2001-87160

(51) Int. Cl.[7] ................ G03F 9/00; G03F 7/20
(52) U.S. Cl. ................ 430/5; 430/319; 430/321; 430/394
(58) Field of Search .............. 430/5, 321, 394, 430/22, 319

(56) References Cited

U.S. PATENT DOCUMENTS 4,864,360 A * 9/1989 Isohata et al. ............... 355/53

* cited by examiner

*Primary Examiner*—John A. McPherson
(74) *Attorney, Agent, or Firm*—Morgan, Lewis & Bockius LLP (57) ABSTRACT

An exposure mask for a liquid crystal display device includes a central exposure area for exposing a first pattern for a liquid crystal display panel area of a substrate and a top exposure area for exposing a second pattern on a top peripheral portion of the substrate, wherein the top exposure area is interconnected to the central exposure area.

16 Claims, 6 Drawing Sheets

EXPOSURE MASK FOR LIQUID CRYSTAL DISPLAY DEVICE AND EXPOSURE METHOD THEREOF

This application claims the benefit of the Korean Application No. P2001-87160 filed on Dec. 28, 2001, which is hereby incorporated by reference in its entirety.

BACKGROUND OF THE INVENTION

1. Field of the Invention

The present invention relates to a liquid crystal display device, and more particularly, to an exposure mask for a liquid crystal display panel and an exposure method thereof for reducing a shot count in developing a photoresist for a plurality of liquid crystal display panel areas on a substrate.

2. Discussion of the Related Art

Generally, a liquid crystal display device includes upper and lower glass substrates and a liquid crystal layer injected between the upper and lower glass substrates. The lower glass substrate includes a plurality of gate lines arranged in one direction at a predetermined interval and a plurality of data lines arranged in a direction vertical to the gate lines at a predetermined interval such that the gate lines and data lines define a plurality of pixel areas in a matrix. A plurality of pixel electrodes are formed in the pixel areas, respectively. Further, a plurality of thin film transistors are formed adjacent to an intersection between gate and data lines in the pixel areas, respectively. The thin film transistors respectively apply signals of the data lines to the corresponding pixel electrodes in accordance with signals of the gate lines, respectively.

A black matrix layer is positioned on the upper glass substrate to prevent light transmittance through areas other than pixel areas. A color filter layer for realizing colors is positioned in the pixel areas within the black matrix layer. A common electrode is formed on an entire surface of the substrate, including the color filter layer. The liquid crystal layer is injected between the common electrode of the upper glass substrate and the pixel electrode of the lower glass substrate.

Typically, a liquid crystal display panel is fabricated from a process that includes forming a plurality of panels from a large-sized glass substrate. More particularly, the upper glass substrates for a plurality of panels are formed on one large-sized glass substrate and lower glass substrates for a plurality of panels are formed on another large-sized glass substrate. The large-sized glass substrates are bonded together and then the bonded large-sized glass substrates are cut into individual panels. Prior to bonding the large-sized glass substrates containing multiple upper/lower substrates, each of the substrates is first prepared by processes that include deposition, photolithography using a mask, etching, thermal treatment, and the like.

A photolithography process using a mask starts with depositing a material to be patterned on a substrate, coating a photoresist layer on the deposited material, carrying out exposure of the photoresist layer with light using a mask or a reticle having a pattern. The photoresist layer is developed using a developing solution to develop just the portion of the photoresist layer exposed to light or, in the alternative, the portion of the photoresist layer unexposed to the light. Subsequent to developing the photoresist, the deposited material is etched using the developed photoresist layer as a mask to replicate the pattern from the mask or reticle. Thus, the mask or reticle for exposure of the photoresist to light should be aligned correctly with the substrate having the material deposited thereon to precisely provide the desired pattern.

In the fabrication of liquid crystal display panels, there is a scan type exposure method and a stepper type exposure method. The scan type exposure method includes the steps of forming a mask having pattern for each individual panel arranged on the large-sized glass substrate and having the same size as the large-sized glass substrates, aligning the mask with the large-sized glass substrate, and applying light using the mask by scanning. The stepper type exposure method is used for a situation in which a plurality of identical panels are arranged on a glass substrate, and exposure is performed separately on each of the panels using a mask that corresponds to each of the panels.

The scan and stepper type exposure methods both have advantages and disadvantages. The scan type exposure method uses a mask that is more expensive than a reticle/mask used in the stepper method. Further, the mask of the scan type method yields a lower resolution than the reticle/mask used in the stepper method. Hence, the stepper method is preferred over the scanning method in the fabrication of liquid crystal display panels.

Figure 1:
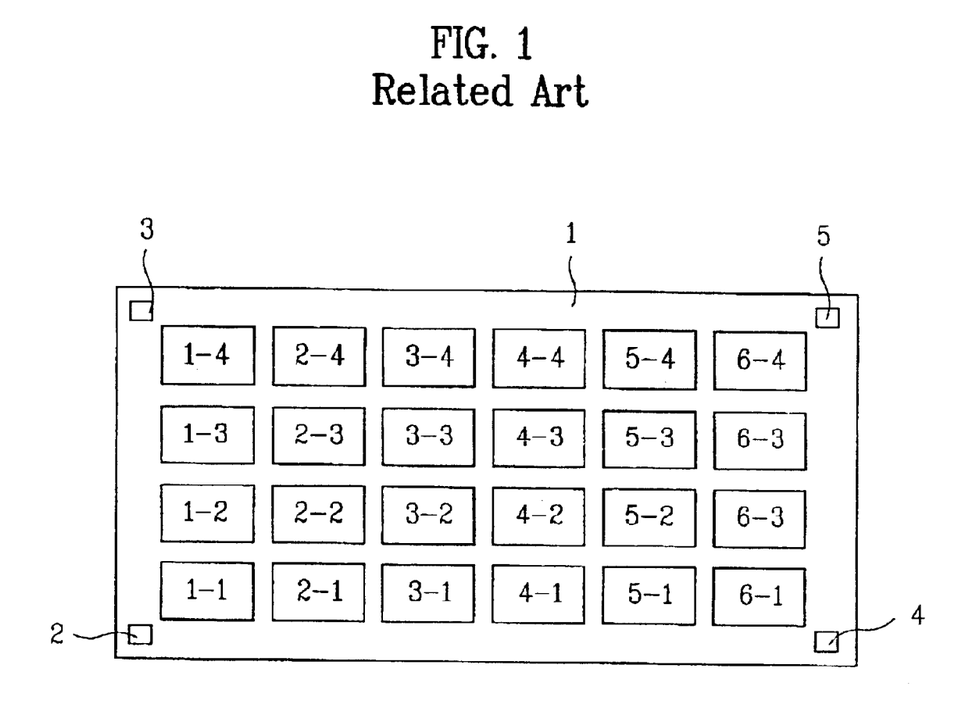
FIG. 1 depicts a plurality of panels arranged on a large-sized glass substrate in the related art.

In reference to the related art in FIGS. 1–4, exposure of a photoresist using the stepper method will be further explained. FIG. 1 depicts a plurality of individual liquid crystal display panel areas 1—1, 1-2, 1-3, . . . , 6-3, 6-4 on a general large-sized glass substrate 1 in the related art. More particularly, there are 6 columns that each have 4 individual liquid crystal display panel areas on a central portion of a glass substrate 1 and alignment keys 2, 3, 4, and 5 formed on corners of the glass substrate 1, respectively. The alignment keys 2, 3, 4, and 5 are for alignment with a stepper and/or other processing devices.

Figure 2:
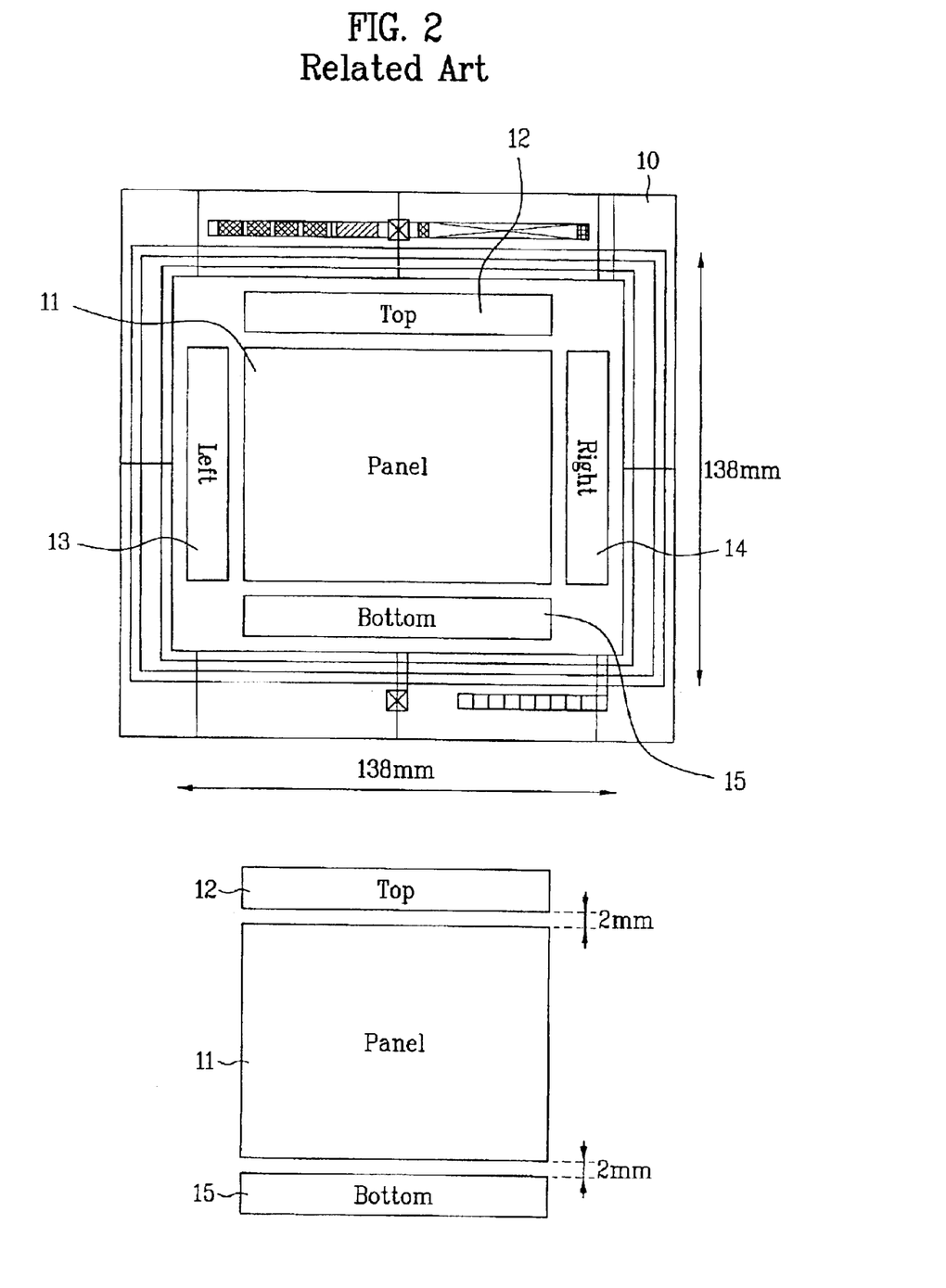
FIG. 2 illustrates a layout of an exposure mask according to the related art.

FIG. 2 illustrates an exposure mask 10 for a stepper according to the related art that is used to expose a single liquid crystal display panel area at a time. The exposure mask 10 shown in FIG. 2 is formed on optical glass for use in a stepper. An exposure mask for use in a stepper can also be referred to as a reticle.

The exposure mask 10 includes a central exposure area 11, top exposure area 12, bottom exposure area 15, a left exposure area 13, and a right exposure area 14. The rectangular central exposure area 11 is for exposing a first pattern on a liquid crystal display panel area of a large-sized glass substrate having a plurality of liquid crystal display panel areas. The rectangular top exposure area 12 of the exposure mask, which is above and separated from the central exposure area 11, is for exposing a second pattern on a top peripheral portion of the large-sized glass substrate. The rectangular bottom exposure area 15 of the exposure mask, which is below and separated from the central exposure area 11, is for exposing a third pattern on a bottom peripheral portion of the large-sized glass substrate. As shown in FIG. 2, the top and bottom exposure areas 12 and 15 are separated by a distance of 2 millimeters from the central exposure area 11. The rectangular left exposure area 13 of the exposure mask, which is on the left of and separated from the central exposure area 11, is for exposing a fourth pattern on a left side peripheral portion of the large-sized glass substrate. The rectangular right exposure area 14 of the exposure mask, which is on the right of and separated from the central exposure area 11, is for exposing a fifth pattern on a right side peripheral portion of the large-sized glass substrate. The top exposure area 12, bottom exposure area 15, left exposure area 13, and right exposure areas 14 are the areas on which alignment keys or test patterns are formed. There is 2 millimeters between each of the exposure areas used as a blade margin in which individual liquid crystal display panels are cut from one another.

Figure 3:
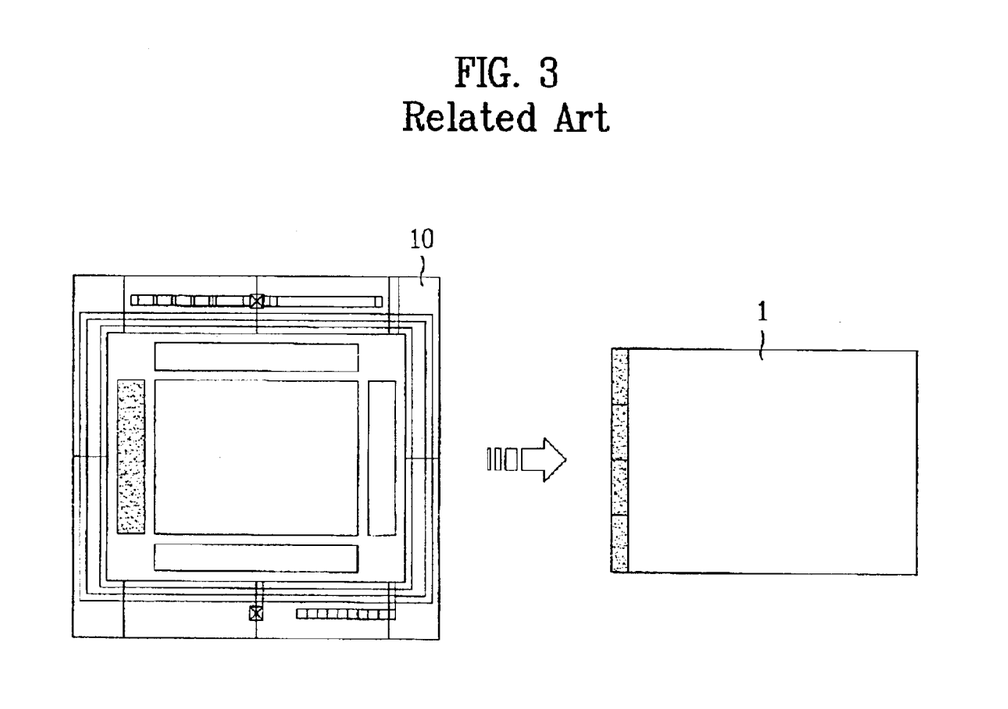
FIG. 3 depicts a related art series of exposures on a left side of a substrate using the exposure mask shown in FIG. 2.
Figure 4:
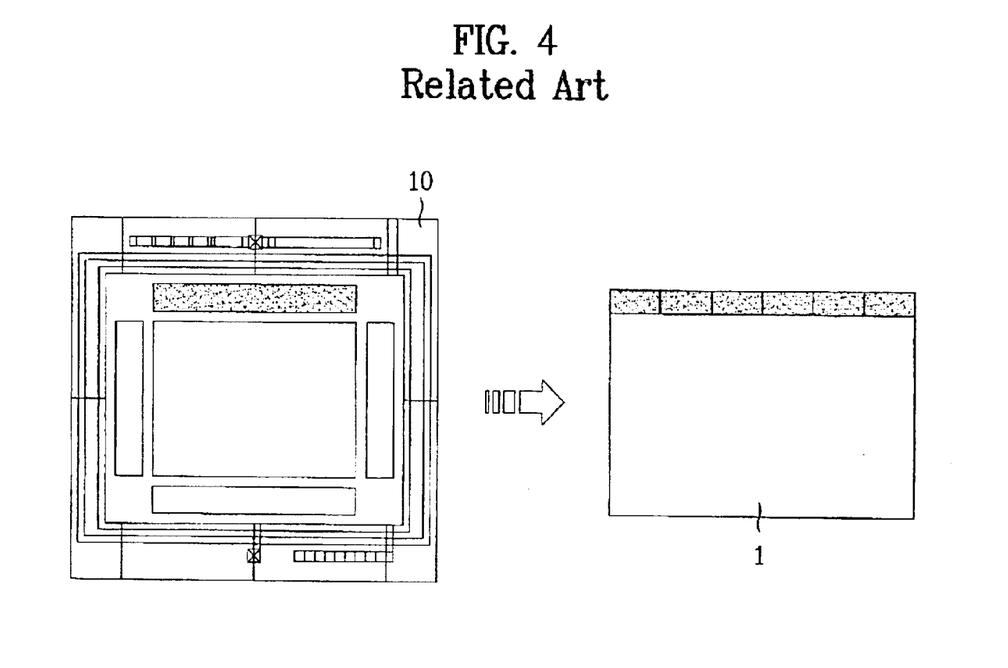
FIG. 4 depicts a related art series of exposures on a top side of a substrate using the reticle shown in FIG. 2.

An example of an exposure method to develop a photoresist for a plurality of liquid crystal display panel areas on a substrate using the exposure mask 10 shown in FIG. 2 will be discussed in reference to FIG. 3 and FIG. 4. The left exposure area 13 of the exposure mask 10 in FIG. 2 is used to develop the four peripheral portions on the left side of the large-sized glass substrate 1 with four individual shots, as shown in FIG. 3. The top exposure area 12 of the exposure mask 10 in FIG. 2 is used to develop the six peripheral portions on the top side of the large-sized glass substrate 1 with six individual shots, as shown in FIG. 4. In addition, the other peripheral portions are exposed one shot at time for a total of twenty shots to expose the peripheral portions of a large-sized glass substrate. Further, twenty four shots are needed such that each panel area of the large-sized glass substrate can be exposed using the central exposure area 11 shown in FIG. 2. Hence, a total of forty-four shots are needed to develop the large-sized glass substrate shown in FIG. 1 with the exposure mask 10 shown in FIG. 2.

Since exposure time needed for a single shot is about two seconds, the large-sized glass substrate having twenty four panels, as described above, requires at least eighty-eight seconds of exposure time. Thus, it takes a lot of time to expose a single substrate and each shot increases the chance that alignment error may occur. Reducing the shot count would reduce the overall amount of exposure time and reduce the probability of alignment error.

SUMMARY OF THE INVENTION

Accordingly, the present invention is directed to an exposure mask for a liquid crystal display device and an exposure method thereof that substantially obviates one or more of the problems due to limitations and disadvantages of the related art.

An object of the present invention is to provide an exposure mask for a liquid crystal display device and an exposure method thereof for reducing a shot count in developing a photoresist for a plurality of liquid crystal display panel areas on a substrate.

Another object of the present invention is to eliminate a boundary margin between exposure areas.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an exposure mask for a liquid crystal display device according to the present invention includes a central exposure area for exposing a first pattern for a liquid crystal display panel area of a substrate and a top exposure area for exposing a second pattern on a top peripheral portion of the substrate, wherein the top exposure area is interconnected to the central exposure area.

In another aspect of the present invention, an exposure method in a liquid crystal display device includes providing an exposure mask having a central exposure area for exposing a first pattern, a top exposure area for exposing a second pattern, a bottom exposure area for exposing a third pattern, a first side exposure area for exposing a fourth pattern and a second side exposure area for exposing a fifth pattern; and exposing a first liquid crystal display panel area and a first peripheral portion of a substrate simultaneously.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 5:
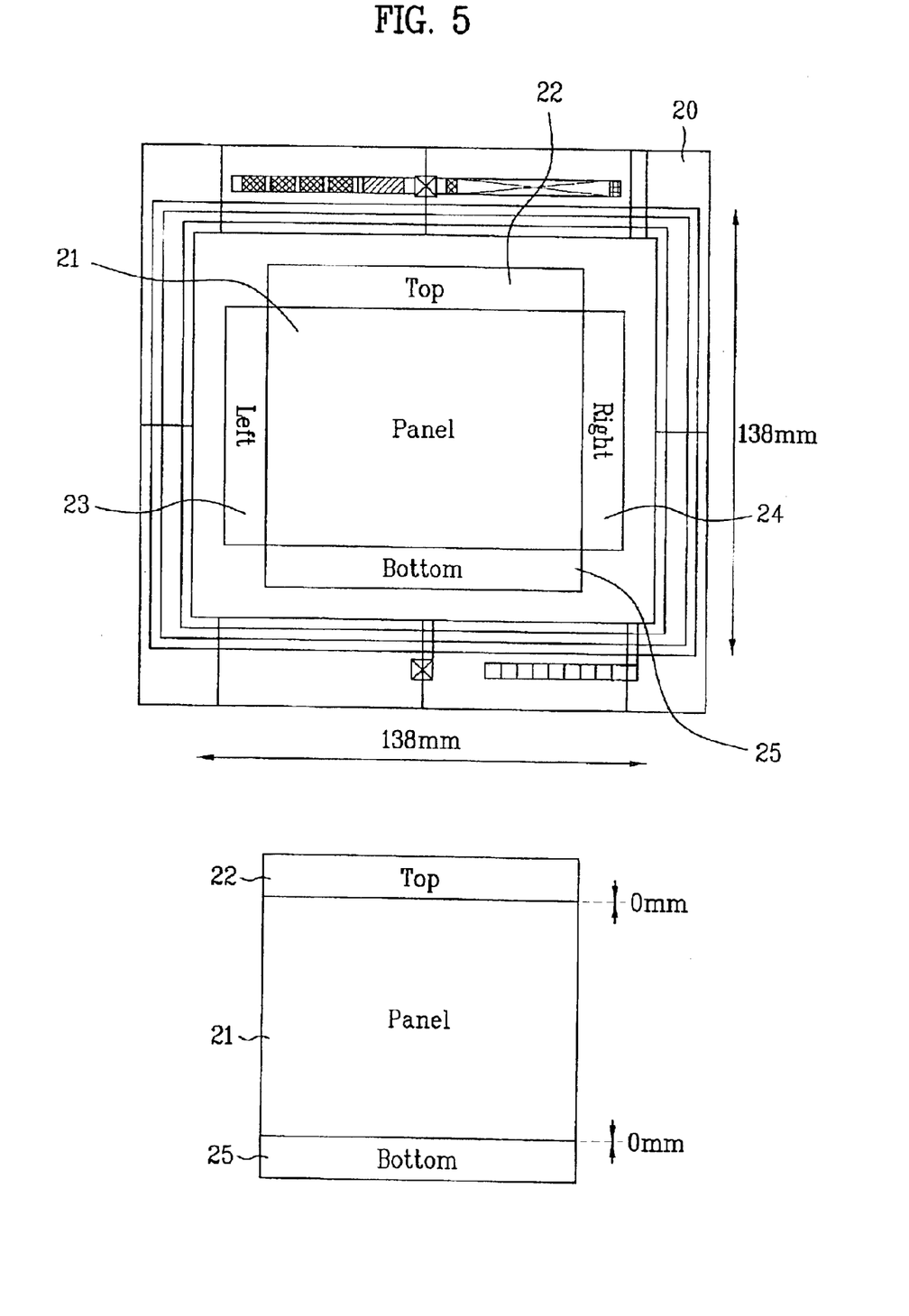
FIG. 5 illustrates a layout of an exposure mask according to an embodiment of the present invention.

Reference will now be made in detail to the preferred embodiments of the present invention, examples of which are illustrated in FIG. 5, FIG. 6, FIG. 7 and FIG. 8. The layout for an exposure mask 20 in accordance with exemplary embodiments of the present invention is shown in FIG. 5. In this example, the exposure mask 20 shown in FIG. 5 is a reticle with a top exposure area 22, a bottom exposure area 25, a left exposure area 23, and a right exposure area 24, which are all interconnected to a central exposure area 21.

The rectangular central exposure area 21 shown in FIG. 5 is for exposing a first pattern on a liquid crystal display panel area of a substrate having a plurality of liquid crystal display panel areas. The rectangular top exposure area 22 of the exposure mask 20, which is above and interconnected to the central exposure area 21, is for exposing a second pattern on a top peripheral portion of the substrate. The rectangular bottom exposure area 25 of the exposure mask 20, which is below and interconnected to the central exposure area 21, is for exposing a third pattern on a bottom peripheral portion of the substrate. As shown in FIG. 5, the top and bottom exposure areas 22 and 25 are not separated by any distance from the central exposure area 21. The rectangular left exposure area 23 of the exposure mask 20, which is on the left of and interconnected with the central exposure area 21, is for exposing a fourth pattern on left side peripheral portion of the substrate. The rectangular right exposure area 24 of the exposure mask 20, which is on the right of and interconnected with the central exposure area 11, is for exposing a fifth pattern on a right side peripheral portion of the substrate.

The top exposure area 22, bottom exposure area 25, left exposure area 23, and right exposure 24 are the areas on which alignment keys or test patterns are formed. The second and third patterns can be the same pattern or different patterns. Likewise, the fourth and fifth patterns can be the same pattern or different patterns.

As shown in FIG. 5, there is no margin between the exposure areas. Instead, all of the exposure areas are interconnected. Exposure is carried out on the desired area(s) of the substrate using respective shutters for the top 22, bottom 25, left 23, and right 24 exposure areas when appropriate. A blade margin area or empty space having a width of at least 5 mm can be obtained between the liquid crystal display panels on the substrate by appropriately closing shutters for the top 22, bottom 25, left 23, and right 24 exposure areas as well as repositioning the exposure mask in relation to the substrate. Either a stepper containing the exposure mask or the substrate can be moved, or both the substrate and the stepper can be moved to reposition the exposure mask in relation to the substrate.

Figure 6:
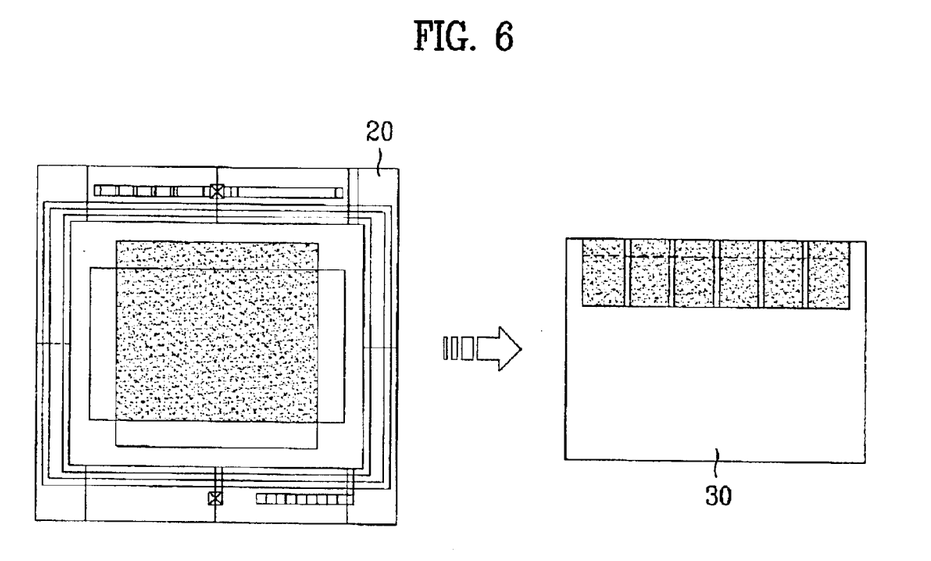
FIG. 6 depicts a series of exposures across the top side of a substrate using the top and central exposure areas of the exposure mask shown in FIG. 5.
Figure 7:
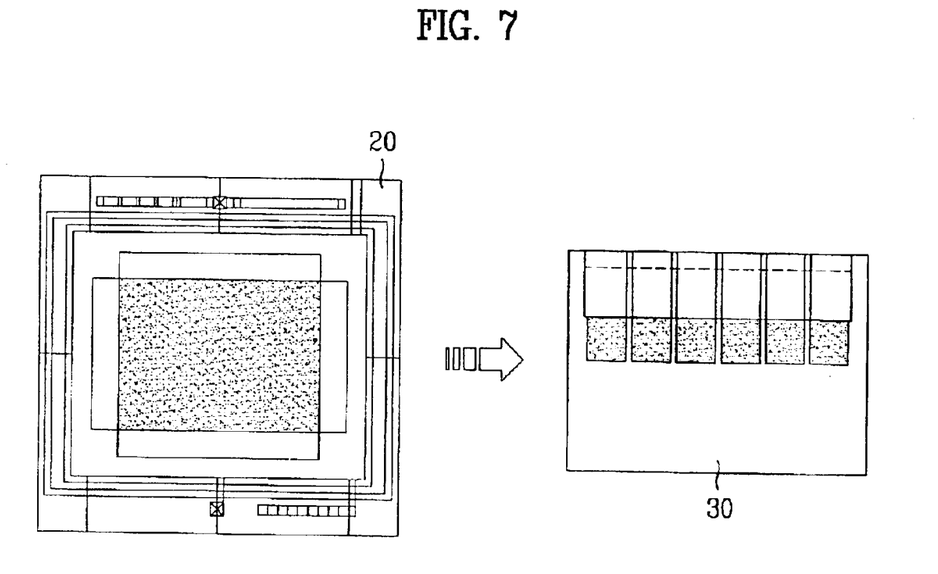
FIG. 7 depicts a series of exposures in the central area of a substrate using the central exposure area of the exposure mask shown in FIG. 5.
Figure 8:
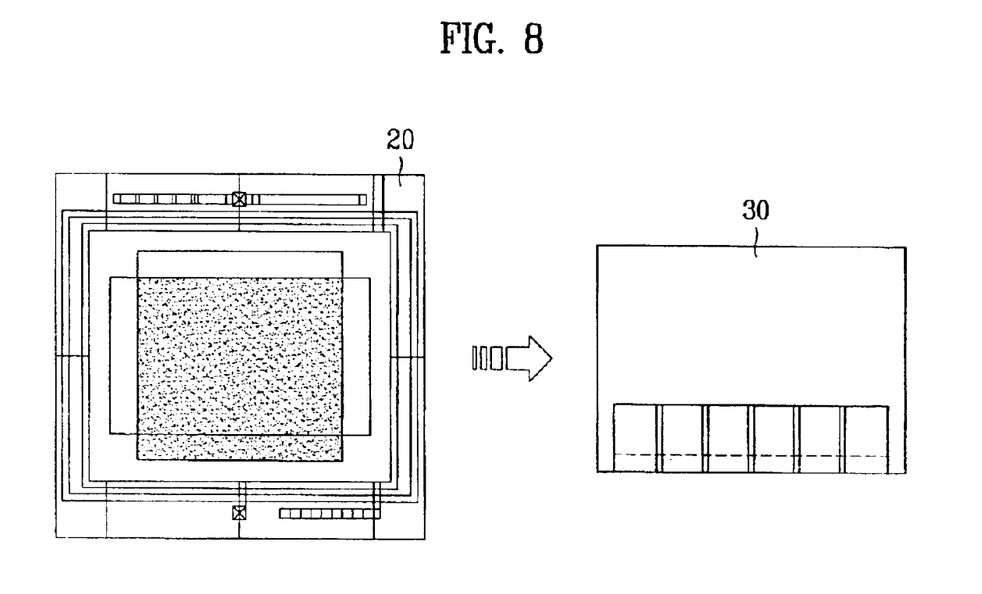
FIG. 8 depicts a series of exposures across the bottom side of a substrate using the central and bottom exposure areas of the exposure mask shown in FIG. 5.

An exposure method in a liquid crystal display device using an exposure mask according to the present invention is explained in reference to FIG. 6, FIG. 7 and FIG. 8. The exposure method is carried out by exposing a liquid crystal panel area and a peripheral portion of the substrate simultaneously using two exposure areas of the exposure mask. Since peripheral portions of the substrate are exposed while an adjacent panel area is exposed, the method reduces the exposure shot count by reducing or eliminating exposure shots that are only for peripheral portions of the substrate.

For example, when exposures are carried out along a top side of side of the substrate 30, the top exposure area and a central exposure area of the exposure mask 20 are used simultaneously in each of the exposures, as shown in FIG. 6. When a row of panel areas in the center of the substrate 30 are exposed, only the central exposure area of the exposure mask 20 is used, as shown in FIG. 7. When exposure are carried out along a lower side of the substrate 30, a bottom exposure area and a central exposure area are used simultaneously in each of the exposures, as shown in FIG. 8. Although not shown, when exposures are carried out along a left or right side, a left or right exposure area and a central exposure area of the exposure mask are used simultaneously.

To carry out the exposures of the peripheral portions and panel areas along the upper side of the substrate, the present invention needs only six shots while the related art would require twelve shots in this example. Further, two peripheral portions and a panel area can be exposed using the central exposure area and two other appropriate exposure areas of the exposure mask at each of the corners of the substrate. Thus, a substrate with 4×6 panel areas can be exposed in twenty-four shots, since the peripheral portions and panel areas at the corners can be exposed in four shots, the rest of the peripheral portions and panel areas along the sides can exposed in twelve shots, and the panel areas in the center of the substrate can be exposed in eight shots.

An exposure method for a liquid crystal display using the exposure mask according to the present invention combines the use of exposure areas that are interconnected. An exposure is carried out on at least two different areas of the substrate simultaneously and subsequent exposures can be configured using respective shutters for the areas to simultaneously expose at least two other different areas having a different configuration. Therefore, the present invention reduces the exposure shot count as well as decreases overall exposure time. In addition, the present invention does not have a blade margin or boundary margin. Thus, there is more area for a patterns in each of the exposure areas of, for example, a reticle.

It will be apparent to those skilled in the art that various modifications and variations can be made in the present invention. Thus, it is intended that the present invention covers the modifications and variations of this invention provided they come within the scope of the appended claims and their equivalents.

It is claimed:

1. An exposure mask for a liquid crystal display device comprising:

a central exposure area for exposing a first pattern for a liquid crystal display panel area of a substrate, the central exposure area corresponding to an entire area of the liquid crystal display panel area; and a top exposure area for exposing a second pattern on a top peripheral portion of the substrate, wherein the top exposure area is interconnected to the central exposure area.

2. The exposure mask for a liquid crystal display device of claim 1, further comprising:

a bottom exposure area for exposing a third pattern on a bottom peripheral portion of the substrate, wherein the bottom exposure area is interconnected to the central exposure area.

3. The exposure mask for a liquid crystal display device of claim 2, further comprising:

a first side exposure area for exposing a fourth pattern on a first side peripheral portion of the substrate, wherein the first side exposure area is interconnected to the central exposure area and separate from the bottom exposure area.

4. The exposure mask for a liquid crystal display device of claim 3, further comprising:

a second side exposure area for exposing a fifth pattern on a second side peripheral portion of the substrate, wherein the second side exposure area is interconnected to the central exposure area and separate from the bottom exposure area.

5. An exposure method for liquid crystal display device, comprising the steps of:

providing an exposure mask having a central exposure area for exposing a first pattern, a top exposure area for exposing a second pattern, a bottom exposure area for exposing a third pattern, a first side exposure area for exposing a fourth pattern and a second side exposure area for exposing a fifth pattern;

exposing all of a first liquid crystal display panel area and a first peripheral portion of a substrate simultaneously using the exposure mask;

repositioning the exposure mask relative to the substrate; and exposing all of a second liquid crystal display panel area and a second peripheral portion of the substrate simultaneously that are adjacent to the first liquid crystal display panel and the first peripheral portion of the substrate, respectively.

6. The method of claim 5, wherein the step of exposing the first liquid crystal display panel area includes using the central exposure area and one of the top, bottom, first side and second side exposure areas.

7. The method of claim 5, wherein the step of exposing the first liquid crystal display panel area includes simultaneously exposing a third peripheral portion of the substrate along with the first liquid crystal display panel area and the first peripheral portion of the substrate using the central exposure area, the top exposure area, and one of the first and second side exposure areas.

8. The method of claim 5, wherein the step of exposing the first liquid crystal display panel area includes simultaneously exposing a third peripheral portion of the substrate along with the first liquid crystal display panel area and the first peripheral portion of the substrate using the central exposure area, the bottom exposure area, and one of the first and second side exposure areas.

9. The method of claim 5, wherein the step of repositioning provides for an empty space of at least 5 mm between the first and second liquid crystal display panel areas.

10. An exposure method for liquid crystal display device, comprising the steps of:
providing an exposure mask having a central exposure area for exposing a first pattern, a top exposure area for exposing a second pattern, a bottom exposure area for exposing a third pattern, a first side exposure area for exposing a fourth pattern and a second side exposure area for exposing a fifth pattern, wherein the first side exposure area and the second side exposure area are separate from the top exposure area and bottom exposure area; and exposing all of a first liquid crystal display panel area and a first peripheral portion of a substrate simultaneously.

11. The method of claim 10, wherein the step of exposing includes using the central exposure area and one of the top, bottom, first side and second side exposure areas.

12. The method of claim 10, wherein the step of exposing includes simultaneously exposing a second peripheral portion of the substrate along with the first liquid crystal display panel area and the first peripheral portion of the substrate using the central exposure area, the top exposure area, and one of the first and second side exposure areas.

13. The method of claim 10, wherein the step of exposing includes simultaneously exposing a second peripheral portion of the substrate along with the first liquid crystal display panel area and the first peripheral portion of the substrate using the central exposure area, the bottom exposure area, and one of the first and second side exposure areas.

14. The method of claim 10, further comprising the step of repositioning the exposure mask relative to the substrate.

15. The method of claim 14, further comprising the step of exposing a second liquid crystal display panel area and a second peripheral portion of the substrate simultaneously that are adjacent to the first liquid crystal display panel and the first peripheral portion of the substrate, respectively.

16. The method of claim 14, wherein the step of repositioning provides for an empty space of at least 5 mm between the first and second liquid crystal display panel areas.

* * * * *